United States Patent [19]

Hazen

[11] Patent Number: 5,668,760
[45] Date of Patent: Sep. 16, 1997

[54] NONVOLATILE MEMORY WITH A WRITE PROTECTION CIRCUIT

[75] Inventor: Peter K. Hazen, Auburn, Calif.

[73] Assignee: Intel Corporation, Santa Clara, Calif.

[21] Appl. No.: 636,529

[22] Filed: Apr. 23, 1996

[51] Int. Cl.[6] .................. G11C 7/00; G11C 8/00
[52] U.S. Cl. .................. 365/189.01; 365/189.05; 365/191; 365/195; 365/193
[58] Field of Search .............. 365/189.01, 189.05, 365/191, 193, 195, 230.01

[56] References Cited

U.S. PATENT DOCUMENTS

| | | | |
|---|---|---|---|
| 5,239,505 | 8/1993 | Fazio et al. | 365/185 |
| 5,457,659 | 10/1995 | Schaefer | 365/222 |
| 5,463,581 | 10/1995 | Koshikawa | 365/189.01 |
| 5,473,565 | 12/1995 | Kusifari | 365/189.01 |
| 5,526,320 | 6/1996 | Zagar et al. | 365/233.5 |
| 5,532,961 | 7/1996 | Mori et al. | 365/189.05 |
| 5,555,209 | 9/1996 | Smith et al. | 365/189.05 |
| 5,559,738 | 9/1996 | Mizobata et al. | 365/189.01 |
| 5,600,606 | 2/1997 | Rao | 365/233 |
| 5,604,714 | 2/1997 | Manning et al. | 365/230.08 |

*Primary Examiner*—Viet Q. Nguyen
*Attorney, Agent, or Firm*—Blakely, Sokoloff, Taylor & Zafman

[57] ABSTRACT

A nonvolatile memory includes a memory array and a control circuit having a command latch and a command decoder. The control circuit receives an output enable signal and a write enable signal to control memory operations of the memory array in accordance with a command latched into the command latch via the command decoder. A write protection circuit is also provided that disables the command latch and the command decoder when the output and write enable signals are both active. The protection circuit includes a pulse generator that generates a reset signal to reset the command latch to the read array state and a control logic that causes the pulse generator to assert the reset signal when an output enable signal and a write enable signal of the memory are both active until after the write enable signal has been forced internally inactive and the command latch closed.

16 Claims, 4 Drawing Sheets

NONVOLATILE MEMORY WITH A WRITE PROTECTION CIRCUIT

FIELD OF THE INVENTION

The present invention pertains to the field of computer memories. More particularly, this invention relates to an electrically erasable and programmable nonvolatile memory with a write protection circuit that prevents the memory from being undesirably written.

BACKGROUND OF THE INVENTION

One type of prior art flash Erasable and electrically Programmable Read-Only Memory ("flash EPROM") is organized into rows and columns. Memory cells are placed at intersections of word lines and bit lines. The flash EPROM can be programmed by a user. Once programmed, the flash EPROM retains its data until erased by electrical erasure. The erased flash EPROM can then be reprogrammed with new data.

Typically, the prior art flash EPROM includes a control circuit that controls the memory operation of the flash EPROM. The control circuit is typically supplied with control signals (e.g., chip enable $\overline{CE}$, output enable $\overline{OE}$, and write enable $\overline{WE}$) and commands to start the memory operations. The commands typically include read, program, and erase commands. The $\overline{CE}$ control signal is the power control of the flash EPROM and is used for device selection of the device. The $\overline{OE}$ control signal is the output control of the flash EPROM. The $\overline{WE}$ control signal allows writes to the control circuit of the flash EPROM.

One disadvantage of the above-described prior art flash EPROM is that undesirable or unwanted write or programming operations may occur in the flash EPROM during a power-up sequence. This is due to the fact that during system power-up of a system within which the flash EPROM resides, invalid bus conditions may occur. For example, an invalid bus condition occurs when the $\overline{OE}$ control signal goes active low while the $\overline{CE}$ and $\overline{WE}$ control signals are active low. Another example is that when the $\overline{OE}$ control signal goes inactive high before the $\overline{CE}$ and $\overline{WE}$ control signals become inactive high, the invalid bus condition also occurs. The invalid bus condition typically causes the control circuit of the flash EPROM to latch in unwanted or invalid write commands which then cause the control circuit to initiate the undesirable or unwanted write operations. The undesirable or unwanted write operations typically damage data integrity of the data stored in the flash EPROM.

In addition, the invalid bus condition may also occur during normal operation of the flash EPROM. This is typically due to the fact that glitch or noise signals may occur on the bus that causes the $\overline{WE}$, $\overline{CE}$, and $\overline{OE}$ signals to become active low together or separately. As described above, the invalid bus condition typically causes unwanted write operations to the flash EPROM.

SUMMARY OF THE INVENTION

One of the features of the present invention is to prevent a nonvolatile memory from being undesirably written.

Another feature of the present invention is to provide a write protection circuit for a nonvolatile memory that prevents unwanted writing to the memory.

A further feature of the present invention is to maintain data integrity of a nonvolatile memory.

A nonvolatile memory includes a memory array and a control circuit having a command latch and an input buffer. The control circuit receives an output enable signal and a write enable signal to control memory operations of the memory array in accordance with a command latched into the command latch via the input buffer. A write protection circuit is also provided that disables the command latch and the input buffer when the output and write enable signals are both active.

A write protection circuit for preventing a memory from being undesirably written is also described. The protection circuit includes (1) a pulse generator that generates a reset signal to reset a command latch of the memory to the read array state and (2) a control logic that causes the pulse generator to assert the reset signal when an output enable signal and a write enable signal of the memory are both active. The command latch, when enabled, is used to latch in a command that causes a memory operation of the memory to occur.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
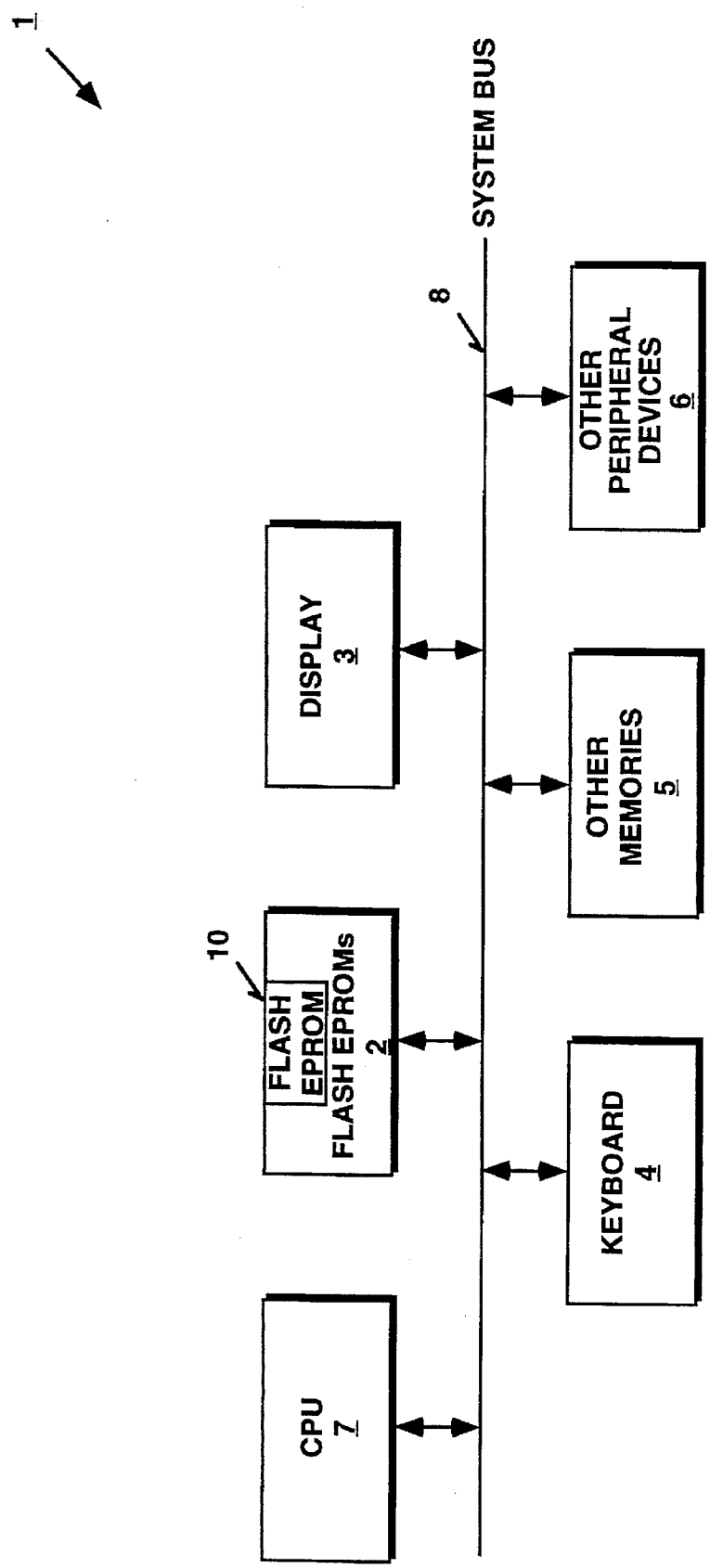
FIG. 1 is a block diagram of a computer system that includes a CPU and a flash EPROM.

FIG. 1 illustrates the architecture of a computer system 1 that includes flash EPROM 10 that implements an embodiment of the present invention. Computer system 1 includes a bus 8 connected to a central processing unit ("CPU") 7, flash EPROMs 2, a display 3, a keyboard 4, and other memories 5. Flash EPROMs 2 includes flash EPROM 10. Flash EPROM 10 can be replaced with other types of memory. For example, flash EPROM 10 can be replaced with a read-only memory ("ROM"), a random access memory ("RAM") or an EPROM. Bus 8 is also connected to other peripheral devices 6. These other peripheral devices may include a modem, a serial communication controller, a local area network ("LAN"), and a parallel communication controller.

Figure 2:
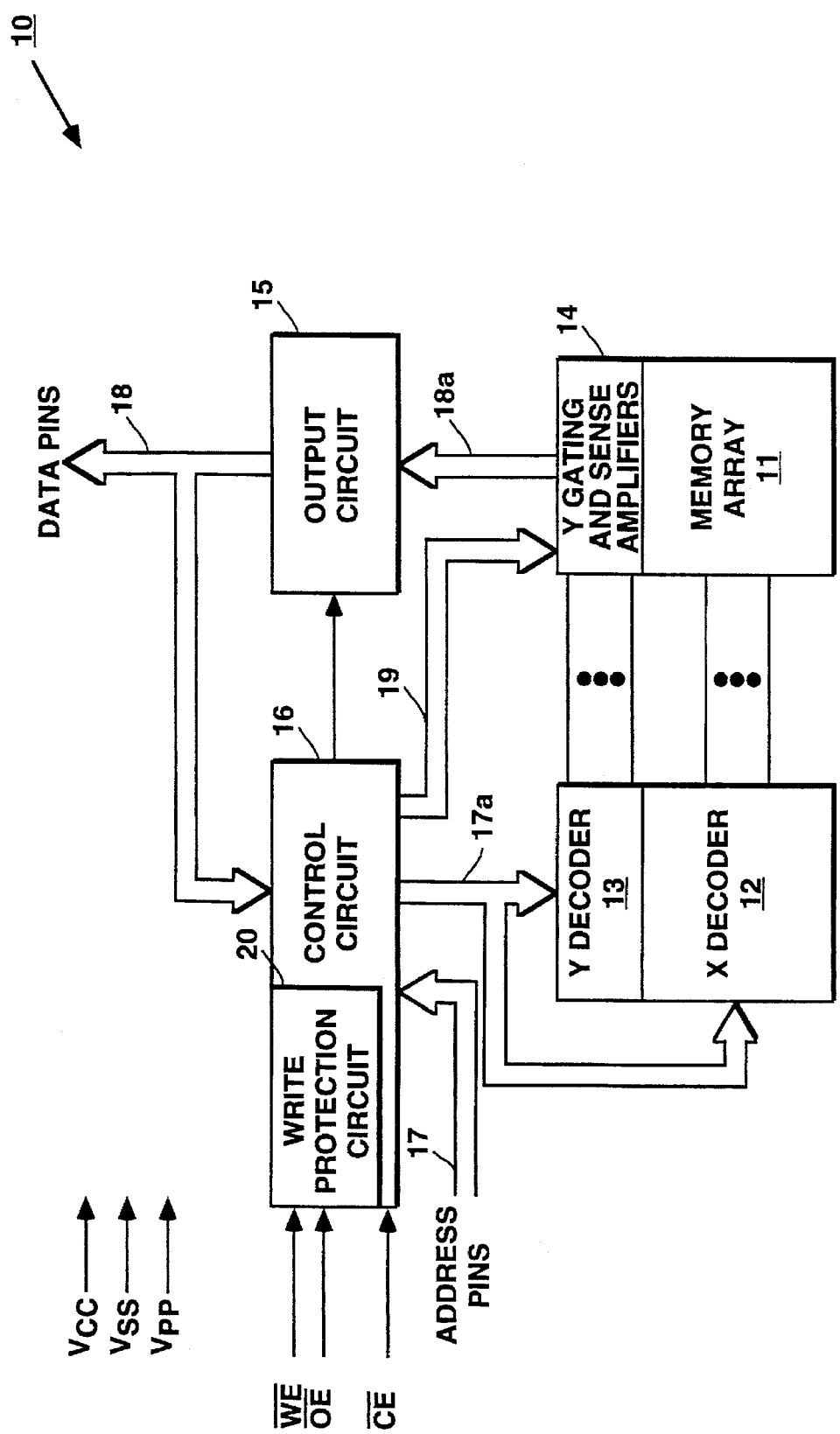
FIG. 2 is a block diagram of a flash EPROM that includes a write protection circuit that implements an embodiment of the present invention.

FIG. 2 is a block diagram of the circuitry of flash EPROM 10, which includes a write protection circuit 20 that implements one embodiment of the present invention. Flash EPROM 10 includes a memory array 11, which is made up of floating gate flash EPROM cells that store data at addresses. For one embodiment, memory array 11 stores 16 Mbits ("Megabits") of data. For alternative embodiments, memory array 11 can be smaller than or larger than 16 Mbits.

Flash EPROM 10 can be used in any kind of computer systems or data processing systems. The computer system can be a personal computer, a notebook, a laptop, a personal assistant, a minicomputer, a workstation, a mainframe, a multiprocessor computer, or any other type of computer system. In addition, the system in which flash EPROM 10 is used can be a printer, a cellular phone, a digital answering system, or any other data storage system.

For one embodiment, flash EPROM 10 employs MOS circuitry and all the circuitry of flash EPROM 10 resides on a single semiconductor substrate.

Flash EPROM 10 includes an X decoder 12 and a Y decoder 13 coupled to memory array 11. X decoder 12 is the row decoder of memory array 11 and Y decoder 13 is the column decoder of memory array 11. X decoder 12 is coupled to the word lines of memory array 11. Y decoder 13 is coupled to the bit lines of memory array 11 via Y gating and sense amplifiers 14. X and Y decoders 12 and 13 receive the respective X and Y addresses via bus 17a.

$V_{PP}$ is the program/erase power supply voltage for flash EPROM 10. $V_{CC}$ is the device power supply voltage for flash EPROM 10 and $V_{SS}$ is ground. For one embodiment, $V_{PP}$ is approximately 12 volts.

$V_{CC}$ can be selected from a number of power supply volts. For one embodiment, $V_{CC}$ can be at approximately either 5 volts or 3.3 volts. For alternative embodiments, $V_{CC}$ can be selected from more or fewer than two power supply voltages.

Flash EPROM 10 also includes a control circuit 16. Control circuit 16 controls the memory operations of flash EPROM 10. The memory operations include read, programming, and erasure operations. Control circuit 16 receives, for example, read, programming, and erasure commands from data bus 18 and addresses from address bus 17 to control the memory operations of flash EPROM 10.

Flash EPROM 10 also includes an output circuit 15. Output circuit 15 is connected to the data pins of flash EPROM 10 via bus 18. As can be seen from FIG. 1, bus 18 is a bi-directional bus that can apply data from output circuit 15 to the data pins and can also apply data and commands from the data pins to control circuit 16.

Output circuit 15 is connected to memory array 11 via bus 18a and Y gating and sense amplifiers 14. Data stored in memory array 11 can be read to output circuit 15 via Y gating and sense amplifiers 14 during a read operation. Output circuit 15 then applies the data to external circuitry (not shown) via the data pins. Output circuit 15 is controlled by control circuit 16 to receive the data via bus 18a and to apply the data to the data pins via bus 18. Output circuit 15 can be implemented by any known output buffer circuit.

Control circuit 16 includes an address buffer (not shown in FIG. 2) for buffering addresses received from address pins of flash EPROM 10 via bus 17. The addresses are then applied to decoders 12 and 13 via bus 17a. Control circuit 16 also includes a data input buffer (also not shown in FIG. 2) for receiving data to be written into memory array 11 from data pins of flash EPROM 10 via bus 18. The data input buffer of control circuit 16 then applies the data to memory array 11 via bus 19 and Y gating 14 during a programming operation.

Figure 3:
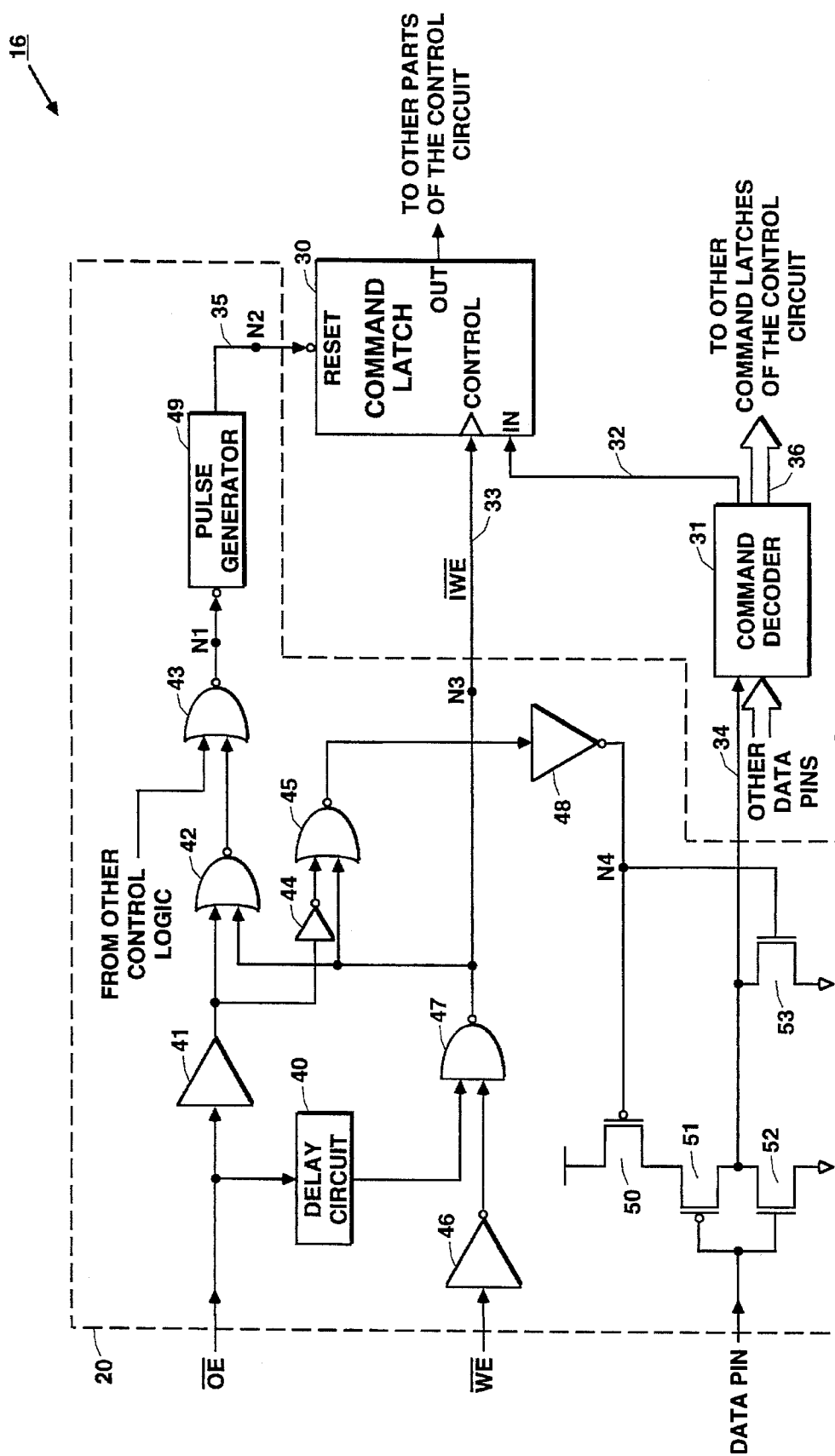
FIG. 3 is a block diagram of the write protection circuit of FIG. 2.

Control circuit 16 also includes command state circuitry and write state circuitry (all are not shown in FIG. 2). The write state circuitry regulates the memory operations of flash EPROM 10 after an initiating command is received in the common state circuitry. The command state circuitry receives the initiating command from the data pins of flash EPROM 10 via bus 18. The command state circuitry decodes the command received and generates the appropriate control signals to the write state circuitry. The command state circuitry of control circuit 16 includes a buffer, a command decoder and command latches (all are not shown in FIG. 2). FIG. 3 shows the command decoder (i.e., command decoder 31) and a command latch 30 of control circuit 16.

Control circuit 16 receives control signals from an external bus (not shown). These control signals are a chip enable control signal $\overline{CE}$, an output enable control signal $\overline{OE}$, and a write enable control signal $\overline{WE}$. The chip enable $\overline{CE}$ signal is the power control signal for flash EPROM 10 and is used for device selection of flash EPROM 10. The output enable $\overline{OE}$ signal is the output control for flash EPROM 10, dependent on device selection. The write enable control signal $\overline{WE}$ allows writes to control circuit 16 while the chip enable control signal $\overline{CE}$ is active low. Moreover, control circuit 16 may also receive other control signals. For example, a power down control signal PWD may be applied to control circuit 16.

When the $\overline{OE}$ signal is asserted (i.e., active), control circuit 16 enables output circuit 15 to receive data from Y gating and sense amplifiers 14 via bus 18a and to apply the data received to the data pins via bus 18. When the $\overline{OE}$ signal is deasserted, output circuit 15 is disabled and does not receive any data. When the $\overline{WE}$ signal is asserted (i.e., active), control circuit 16 allows its command latch to receive a command from the data pins via bus 18. The command that is applied to the command latch of control circuit 16 is first decoded by the command decoder of control circuit 16. When the $\overline{WE}$ signal is then deasserted, the command latch is closed (i.e., deactivated), thus latching in the decoded command. After the command latch is closed, the command latch no longer accepts any command signal.

The $\overline{WE}$ and $\overline{OE}$ signal are not allowed to be active at the same time. This is due to the fact that when they both become active, an invalid condition arises which typically causes the command latch of control circuit 16 to latch in the data stored in output circuit 15.

For example, if the $\overline{OE}$ signal goes active low when both the $\overline{WE}$ and $\overline{CE}$ signals are active low, output circuit 15 becomes enabled while the command latch of control circuit 16 is also enabled. This may cause the command latch of control circuit 16 to latch in, as a command, the data supplied to output circuit 15, which in turn causes flash EPROM 10 to malfunction. This problem, however, still exists even if the $\overline{OE}$ signal is used to override the $\overline{WE}$ signal (i.e. disabling $\overline{WE}$) inside control circuit 16. This is due to the fact that the active $\overline{OE}$ signal overrides the active $\overline{WE}$ signal only after the $\overline{OE}$ signal has become active low. At this time, the data from output circuit 15 has already been applied to the command latch of control circuit 16. When the $\overline{WE}$ signal is then forced inactive high, the command latch is closed, thus latching in the data from output circuit 15.

In addition, the command latch may also latch in an invalid command when the $\overline{OE}$ signal goes inactive high when the $\overline{CE}$, $\overline{WE}$, and $\overline{OE}$ signals am all at the active low level. This may occur because the internal $\overline{WE}$ signal will go active low when the $\overline{OE}$ signal goes inactive high. The active $\overline{WE}$ signal then enables the command latch to receive the data applied from output circuit 15. When the $\overline{WE}$ signal then becomes inactive high, the command latch is closed, thus latching in the data from output circuit 15.

In order to prevent the command latch from latching in invalid commands when an invalid bus condition occurs to flash EPROM 10 when $\overline{OE}$ signal goes active low and both the $\overline{WE}$ and $\overline{CE}$ signals are active low, write protection circuit 20 is provided in control circuit 16 in accordance with one embodiment of the present invention (1) to reset the command latch of control circuit 16 when the invalid condition occurs and (2) then force the $\overline{WE}$ signal internally inactive after the command latch has been reset to the read array state such that no invalid command is latched into the command latch.

In order to prevent the command latch from latching in invalid commands when an invalid bus condition occurs to flash EPROM 10 when the $\overline{CE}$, $\overline{OE}$, and $\overline{WE}$ signals are all at the active low level, write protection circuit 20 resets the command latch of control circuit 16 when this invalid bus condition occurs. This prevents commands from bus 18 from being driven into control circuit 16 and latched into the control latch. The structure and connection of write protection circuit 20 within control circuit 16 is shown in FIG. 3, which will be described in more detail below.

Referring back to FIG. 2, the structure of control circuit 16 except write protection circuit 20 can be implemented by any known flash EPROM control circuit. For example, U.S. Pat. Nos. 5,369,647, 5,355,464, 5,353,256, and 5,327,383 describe a control circuit that controls the memory operations of a flash EPROM. Therefore, those circuits of control circuit 16 will not be described in more detail below in order not to unnecessarily obscure the description of the present invention.

Referring to FIG. 3, the circuit of write protection circuit 20 is shown, along with other circuits (i.e., a command latch 30 and a command decoder 31) of control circuit 16. FIG. 3, however, does not show all the circuits of control circuit 16 in order not to unnecessarily obscure the description of the present invention. FIG. 3 only shows, other than write protection circuit 20, command latch 30 and command decoder 31 of control circuit 16 to which write protection circuit 20 of control circuit 16 is connected.

As can be seen from FIG. 3, command latch 30 includes a reset input that allows a reset signal from write protection circuit 20 to reset command latch 30. In addition, command latch 30 includes a control input that receives a write enable signal $\overline{IWE}$. When the $\overline{IWE}$ signal is active, command latch 30 is enabled (i.e., opened) to receive data signal from its data input IN. The data input of command latch 30 is connected to command decoder 31. Command decoder 31 decodes an incoming command and generates a command signal. The command signal is either applied to command latch 30 via line 32 or other command latches (not shown in FIG. 3) of control circuit 16 via bus 36, depending on the command decoded. For example, if command latch 30 is designated in control circuit 16 to store the memory programming command signal and if the command applied to command decoder 31 is a memory programming command, command decoder 31 generates the memory programming command signal to the IN input of command latch 30 via line 32. When command decoder 31 receives a command that is not the memory programming command, command decoder 31 does not generate any signal on line 32. In this case, command decoder 31 generates the appropriate command signal to one of the other command latches that corresponds to the command received at command decoder 31 via a signal line of bus 36. Each of the other latches has the same circuit configuration as command latch 30 and is connected to lines 33 and 35 of write protection circuit 20 in the same manner as command latch 30. Command latch 30 can be implemented by any known latching circuit.

Command decoder 31 is connected to the data pins of flash EPROM 10 (FIG. 2) via bus 18. As can be seen from FIG. 3, one of the data pins of flash EPROM 10 is connected to command decoder 31 via transistors 50 through 53 of write protection circuit 20. Transistors 50 and 51 are P-channel transistors and transistors 52–53 are N-channel transistors. Transistors 51 and 52 form the input buffer and transistors 50 and 53 function to disable the input buffer and its output. As can be seen from FIG. 3, the output of the input buffer is connected to command decoder 31. When the output of the input buffer formed by transistors 50–53 is disabled, command decoder 31 is defaulted to generate a read command signal, regardless of the actual command applied at the data pins of flash EPROM 10.

Figure 4:
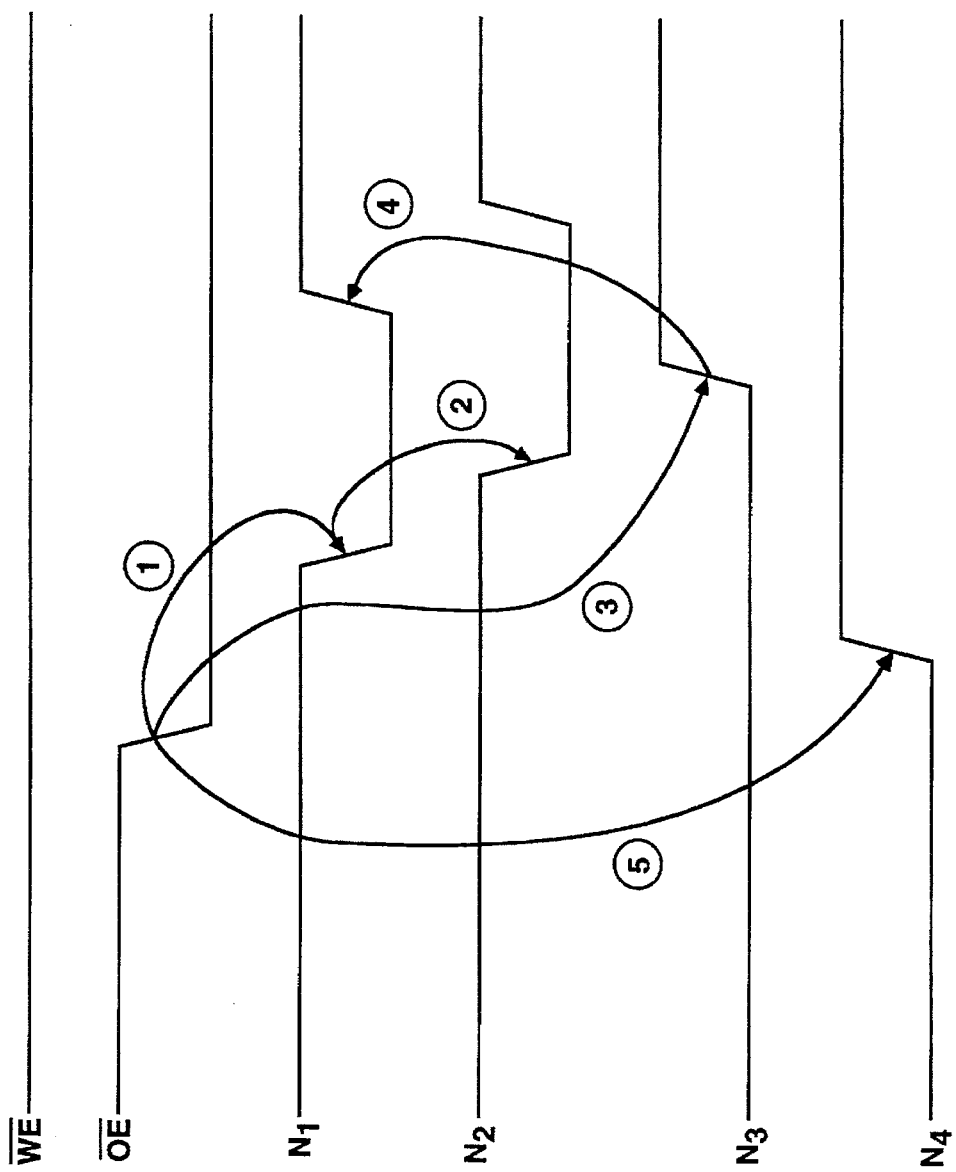
FIG. 4 is a timing diagram showing the relationship of various signals of the write protection circuit of FIG. 3.

Write protection circuit 20 also includes a pulse generator 49 that is connected to the reset input of command latch 30. Pulse generator 49 generates an active low reset pulse signal to reset command latch 30 based on the output signal of NOR gate 43. Pulse generator 49 is activated to generate the active low reset pulse signal when the output signal of NOR gate 43 is at active low level. The pulse width of the reset pulse signal generated by pulse generator 49 should be set such that command latch 30 remains to be reset until after the $\overline{IWE}$ signal goes inactive high. The $\overline{IWE}$ signal is the internal write enable signal of the $\overline{WE}$ signal and is used to enable (i.e., open) command latch 30. FIG. 4 shows the relationship of various signals of FIG. 3, which will be described in more detail below. Write protection circuit 20 also includes an input buffer 41, NOR gates 42, 43, and 45, inverters 44, 46, and 48 and a NAND gate 47. In addition, write protection circuit 20 also includes a delay circuit 40. Logic gates 41 through 48 form the control logic of write protection circuit 20 that (1) causes pulse generator 49 to generate the reset pulse signal and (2) disables the input buffer formed by transistors 50–53 such that command decoder 31 is defaulted to only generate the read command signal. The function of delay circuit 40 is to delay forcing the $\overline{IWE}$ signal logically inactive high until after command latch 30 has been reset to the read array state by pulse generator 49. This also prevents command latch 30 from latching in an invalid command before being reset. One input signal of NOR gate 43 is from NOR gate 42 and the other input is from other control logic (not shown) of control circuit 16. This signal from other control logic of control circuit 16 is used to disable NOR gate from generating the enable signal to activate pulse generator 49. This input signal will not be described in more detail below.

The operation of write protection circuit 20 is now described below, also in conjunction with FIGS. 3 and 4. As can be seen from FIGS. 3 and 4, when the $\overline{WE}$ signal is active low (we now assume the $\overline{CE}$ signal is active low throughout the following description) and the $\overline{OE}$ signal starts to go active low, NOR gate 43 activates pulse generator 49 to assert the reset pulse signal to reset command latch 30 (see FIG. 4). At this time, delay circuit 40 delays deasserting the $\overline{IWE}$ signal such that command latch 30 is reset before being closed (see FIG. 4). Meanwhile, inverter 48 causes transistor 50 to be turned off and transistor 53 to be turned on, forcing line 34 to ground. This causes command decoder 31 to default to only generate the read command signal. Thus, even if command latch 30 returns to its normal state by the reset pulse signal before the $\overline{IWE}$ signal is deasserted, the latched-in command signal would not damage data integrity of flash EPROM 10.

Then, the $\overline{IWE}$ signal is deasserted by NAND gate 47 (see FIG. 4). This causes command latch 30 to be closed while still being at the reset state. After the $\overline{IWE}$ signal is deasserted by the active and delayed $\overline{OE}$ signal, the output of NOR gate 43 is deasserted and pulse generator 49 stops generating the reset pulse signal (see FIG. 4).

When the $\overline{WE}$ and $\overline{OE}$ signals are both active low and the $\overline{OE}$ signal starts to go inactive high, the $\overline{IWE}$ signal is held inactive high for the delay period specified by delay circuit 40. Therefore, if the $\overline{WE}$ signal also goes inactive high during this delay period, the $\overline{IWE}$ signal remains inactive high, thus preventing command latch 30 from latching in any signal.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A nonvolatile memory, comprising:

(A) a memory array;

(B) a control circuit having a command latch and a command decoder, the control circuit receiving an output enable signal and a write enable signal to control memory operations of the memory array in accordance with a command latched into the command latch via the command decoder;

(C) a write protection circuit that disables the command latch and the command decoder when the output and write enable signals are both active.

2. The nonvolatile memory of claim 1, wherein the protection circuit further comprises (i) a pulse generator that generates a reset signal to reset the command latch;

(ii) a control logic that causes the pulse generator to assert the reset signal when the output and write enable signals are active.

3. The nonvolatile memory of claim 2, wherein the protection circuit further comprises a disable circuit that disables the command decoder when the output enable signal becomes active while the write enable signal is active.

4. The nonvolatile memory of claim 3, wherein the protection circuit further comprises a delay circuit that forces the write enable signal internally inactive only after the command latch is reset.

5. The nonvolatile memory of claim 2, wherein the pulse generator asserts the reset signal until after the write enable signal has been forced internally inactive and the command latch closed.

6. The nonvolatile memory of claim 1, wherein the memory array is an electrically erasable and programmable nonvolatile memory.

7. A computer system, comprising:

(A) a microprocessor;

(B) a bus coupled to the microprocessor;

(C) a nonvolatile memory coupled to the bus, wherein the nonvolatile memory further comprises (I) a memory array;

(II) a control circuit having a command latch and a command decoder, the control circuit receiving an output enable signal and a write enable signal to control memory operations of the memory array in accordance with a command latched into the command latch via the command decoder;

(III) a write protection circuit that disables the command latch and the command decoder when the output and write enable signals are both active.

8. The computer system of claim 7, wherein the protection circuit further comprises (i) a pulse generator that generates a reset signal to reset the command latch;

(ii) a control logic that causes the pulse generator to assert the reset signal when the output and write enable signals are active.

9. The computer system of claim 8, wherein the protection circuit further comprises a disable circuit that disables the command decoder when the output enable signal becomes active while the write enable signal is active.

10. The computer system of claim 9, wherein the protection circuit further comprises a delay circuit that forces the write enable signal internally inactive only after the command latch is reset.

11. The computer system of claim 8, wherein the pulse generator asserts the reset signal until after the write enable signal has been forced internally inactive.

12. The computer system of claim 7, wherein the nonvolatile memory is an electrically erasable and programmable nonvolatile memory.

13. A protection circuit for preventing a memory from being undesirably written, comprising:

(A) a pulse generator that generates a reset signal to reset a command latch of the memory;

(B) a control logic that causes the pulse generator to assert the reset signal when an output enable signal and a write enable signal of the memory are both active.

14. The protection circuit of claim 13, further comprising a disable circuit that disables a command decoder coupled to an input of the command latch when the output enable signal becomes active while the write enable signal is active.

15. The protection circuit of claim 14, further comprising a delay circuit that forces the write enable signal internally inactive only after the command latch is reset.

16. The protection circuit of claim 13, wherein the pulse generator asserts the reset signal until after the write enable signal has been forced internally inactive.

* * * * *

UNITED STATES PATENT AND TRADEMARK OFFICE
CERTIFICATE OF CORRECTION

| | | |
|---|---|---|
| PATENT NO. | : | 5,668,760 |
| DATED | : | September 16, 1997 |
| INVENTOR(S) | : | Peter K. Hazen |

It is certified that error appears in the above-identified patent and that said Letters Patent is hereby corrected as shown below:

In column 4 at line 47 delete "am" and insert --are--

Signed and Sealed this

Sixth Day of January, 1998

*Attest:*

*Attesting Officer*

BRUCE LEHMAN
Commissioner of Patents and Trademarks